(12) United States Patent
Wilstrup et al.

(10) Patent No.: US 6,449,570 B1
(45) Date of Patent: Sep. 10, 2002

(54) ANALYSIS OF NOISE IN REPETITIVE WAVEFORMS

(75) Inventors: Jan B. Wilstrup, Moundsview, MN (US); Dennis M. Petrich, San Jose, CA (US); Steven H. Ulsund, Blaine, MN (US); Christopher Kimsal, Chanhassen, MN (US); Mark J. Emineth, Minneapolis, MN (US)

(73) Assignee: Wavecrest Corporation, Edina, MN (US)

( * ) Notice: Subject to any disclaimer, the term of this patent is extended or adjusted under 35 U.S.C. 154(b) by 0 days.

(21) Appl. No.: 09/717,628

(22) Filed: Nov. 21, 2000

Related U.S. Application Data

(63) Continuation of application No. 09/039,121, filed on Mar. 13, 1998, now Pat. No. 6,185,509.
(60) Provisional application No. 60/039,624, filed on Mar. 13, 1997.

(51) Int. Cl.$^7$ .......................... G06F 17/00; H04B 15/00
(52) U.S. Cl. .......................................... 702/69; 702/199
(58) Field of Search .............................. 702/66–69, 199; 704/203, 269; 708/5, 403, 426, 813; 713/400, 502; 73/86; 324/76.12, 76.39; 370/210; 382/280; 368/63, 118, 120, 121; 377/20

(56) References Cited

U.S. PATENT DOCUMENTS

| | | |
|---|---|---|
| 3,626,168 A | 12/1971 | Norsworthy |
| 4,074,358 A | 2/1978 | Caputo et al. |
| 4,092,981 A | 6/1978 | Ertl |
| 4,301,360 A | 11/1981 | Blair |
| 4,302,689 A | 11/1981 | Brodie |
| 4,323,796 A | 4/1982 | Lathrope |
| 4,393,318 A | 7/1983 | Takahashi et al. |
| 4,495,586 A | 1/1985 | Andrews |
| 4,504,155 A | 3/1985 | Ruggieri |
| 4,608,647 A | 8/1986 | White et al. |
| 4,634,993 A | 1/1987 | Koen |
| 4,806,790 A | 2/1989 | Sone |
| 4,879,661 A | 11/1989 | Olsen |
| 4,908,784 A | 3/1990 | Box et al. |
| 4,962,325 A | 10/1990 | Miller et al. |
| 4,982,350 A | 1/1991 | Perna et al. |
| 5,068,754 A | 11/1991 | Garde |
| 5,162,670 A | 11/1992 | Itakura et al. |
| 5,341,037 A | 8/1994 | Miki et al. |
| 5,343,089 A | 8/1994 | Itakura et al. |
| 5,352,933 A | 10/1994 | Kogan |
| 6,185,509 B1 | 2/2001 | Wilstrup et al. |

FOREIGN PATENT DOCUMENTS

EP           0 543 139 A1     5/1993

OTHER PUBLICATIONS

Vernotte, F. et al., "A New Multi–Variance Method for the Oscillator Noise Analysis", *1992 IEEE Frequency Control Symposium,* pp. 284–289 (May 27, 1992).

Primary Examiner—Thomas M Heckler
(74) Attorney, Agent, or Firm—Merchant & Gould P.C.

(57) ABSTRACT

A system is disclosed for precisely measuring time intervals, used to either characterize or diminish noise components in repetitive waveforms. An interval timer generates a whole number count of cycles in combination with beginning and ending ramps capable of resolving fractions of a cycle, to accurately register the time interval. Selection logic can be implemented to time either single periods or spans of multiple consecutive periods of the waveforms. Multiple time measurements are arranged in sets, each set corresponding to a different span of "N" consecutive periods over a range of values for N. A variance of each set is generated, and an array of variance vs N provides a function having properties of an auto-correlation function. Instrument jitter can be reduced based on measurements of period spans rather than individual periods, and is reduced in proportion to the increasing size of the measured span. These techniques are enhanced by random statistical samples, obtained by a dithering of the measurement rate. This also diminishes the impact of aliasing products.

9 Claims, 11 Drawing Sheets

Random Measurements:

ANALYSIS OF NOISE IN REPETITIVE WAVEFORMS

"This application is a continuation of application Ser. No. 09/039,121, filed Mar. 13, 1998, now U.S. Pat. No. 6,185,509, which claims the benefit of priority of provisional application Ser. No. 60/039,624, filed Mar. 13, 1997, which applications are incorporated herein by reference."

BACKGROUND OF THE INVENTION

The present invention relates to instruments for generating precision measurements of time intervals between measured events in pulse streams, and more particularly to characterizing noise in repetitive waveforms.

The semiconductor industry is continually striving to satisfy demands for higher data processing speeds, in connection with complex computers, high definition video graphics, telecommunications, and other fields that place a high premium on rapid trasfer of large amounts of data. Microprocessor systems move data at speeds based on high frequency clocks that determine the rate at which signals are clocked through semiconductor circuitry. During this decade, typical clock frequencies have increased from about 33 MHz to about 200 MHz, and semiconductor devices currently under development are expected to operate under clock frequencies that exceed 1 billion Hz.

Typical microprocessors can have from 256 to 512 connector pins or pads for the input and output of data Clocked signals exit the device through as many as 100 of the connector pins, and it is imperative to know the relationship of each clocked pulse to the pulses on the other output pins. Irregular timing, if not corrected, can cause errors in the semiconductor device.

When timing signals at higher frequencies, it becomes increasingly important to analyze, and if possible reduce, the intrinsic noise components of data and clock signals. This noise is known by several terms including jitter, wander, unintended modulation, and phase noise. Jitter, as such noise is referred to herein, concerns the instability of pulse streams, especially repetitive waveforms. Ideally, repetitive pulse ses are absolutely stable, in that each individual pulse or cycle has the same width or duration. Jitter represents a deviation, perhaps in picoseconds, from the ideal. As clock frequencies within semiconductor devices and other high speed applications increase, the jitter component becomes more pronounced. In high definition video graphic chips, jitter can cause a flicker or jumping of the video image. Jitter can cause glitches in audio devices, and disparity between output and input serial data in network applications. Nowadays, many semiconductors are designed to allow no more than a 500 picosecond (i.e. 500 trillionth of a second) error between one output pin and another. Tolerances in high definition video applications are more stringent, e.g. as low as 100 picoseconds. Accordingly, measurements of jitter and other aspects of timing are critical during the prototyping and development stages of semiconductor devices.

Therefore, it is an object of the present invention to provide an apparatus and method for more accurately characterizing the noise component of data and clock signals.

Another object is to provide a process for measuring and characterizing jitter in a manner that reduces jitter contributed by the measurement system.

A further object is to provide a system for sampling a waveform in a manner that improves the distinction between true noise frequencies and frequencies detected due to aliasing.

Yet another object is to provide a time interval measurement system in which a limited variance of a nominal or average sampling frequency, and an accumulation of multicycle durations to form sets of data corresponding to different cycle spans, lead to more rapid and more accurate measurements and characterization of jitter components in repetitive wave forms.

SUMMARY OF THE INVENTION

To achieve these and other objects, there is provided a process for generating a function with characteristics of an auto-correlation function indicating periodic jitter in a repetitive waveform, including:

a. timing a duration of a series of "n" consecutive periods in a repetitive waveform a plurality of times for a given "n," where "n" is an integer, to generate a set of time values associated with the given "n;"

b. determining a variance value for the set of time values;

c. repeating steps (a) and (b) for a plurality of different values of "n;" and d. generating an array of the variance values as a function of the values of "n."

Note that one of the time value sets may be based on measuring one period, i.e. when n=1. The variance associated with each set of time values can be determiined according to the equation:

$$\text{Var.}[t(N)] = (1/M) \sum_{i=1}^{M} [t(N) - \bar{t}(N)]^2 \quad (1)$$

Where $\bar{t}$ equals the average of the time values of the set, "M" equals the number of measurements in the set, and t(N) equals the time value for a particular measurement in the series from i=1 through i=M. As one example, each set of multi-cycle time values may consist of 100 individual time measurements, and sets may be provided over a range of 1,000 values of "n," beginning at one cycle and incrementing the value of "n" by 1 for each succeeding set of time values.

The time measurements of consecutive cycles preferably are done according to a measurement rate uncorrelated to the jitter components of the waveform under study. More preferably the measurement rate is dithered about an average or nominal measurement rate. This insures that each set of time values yields a more random statistical sample, to insure a better measurement of variance.

According to another preferred analysis approach, the auto-correlation function derived by generating variance values as a function of "n" is mirrored to generate variance as a function of (−n), which exhibits the same behavior as the function based on positive n values. A second derivative of the mirrored function is generated, then multiplied by a window function, e.g. a triangular function. Then, a Fourier transform is performed to convert the time domain data into frequency domain data. The resulting function further can be subjected to a square root function to yield jitter as a function of frequency.

Yet another aspect of the present invention is a process for characterizing an angle (phase or frequency) modulating component in an angle modulated signal, including:

a. timing a duration of a series of "n" consecutive periods in a repetitive waveform for a plurality of times for a given n where n is an integer, to generate a set of measured time values associated with the given n;

b. generating a range value indicating a difference between the maximum measured time value and the minimum measured time value for the set of measured time values;

c. repeating steps (a) and (b) for a plurality of different values of n;

d. using the range values obtained in step (c) to generate a range array depicting the range of values as a function of the values of n;

e. differentiating the range array with respect to n; and f. reconstructing the differentiated range array symmetrically around a designated location to provide a reordered array.

The reordered array, with appropriate scaling, can be interpreted as a time domain view of the modulating waveform, with a 180 degree phase ambiguity. Further resolution of the angle modulating component is achieved through the following additional steps:

g. integrating the reordered array to provide a simulated range array;

h. comparing the simulated array with the range array resulting from step (d);

i. selectively inverting portions of the reordered array resulting from step (f); and j. repeating steps (g), (h), and (i) until a close correspondence is found between the simulated range array and the range array resulting from step (d).

As compared to the previously discussed technique based on variance values, recovering modulating signal characteristics based on range data is a more complex approach. At the same time, because range data contains phase information not contained in variance data, information based on ranges can provide a more detailed reconstruction of the modulating signal.

Another aspect of the present invention is a process for characterizing an angle (frequency or phase) modulating component in an angle modulated signal, including:

a. measuring a waveform multiple times at a measurement rate that varies about a nominal measurement rate, between a maximum measurement rate greater than the nominal rate and a minimum measurement rate less than the nominal rate;

b. based on said measuring, timing a duration of "n" consecutive periods of the waveform during each episode of said measuring, where "n" is an integer, to generate an array of time values, one time value associated with each measuring episode; and c. processing the array of time values to generate an array of the time values as a function of frequency.

The preferred approach to generate the array of time values as a function of frequency, is to apply a Fourier transform to the initial array of time values.

In connection with measuring a waveform at a varying measurement rate, there is provided a more robust averaging method; namely, timing a duration of a series of "n", s consecutive periods of a repetitive waveform, where n is an integer of at least two, to generate a multiple period time value, and then determining an average period by dividing the multiple time value by n.

As compared to conventional averaging methods used to reduce instrumentation noise, the multiple-period averaging approach requires less time, because fewer measurements are required. In particular, the present process requires just one measurement to generate one multiple-period time value, as opposed to the requirement under conventional averaging techniques, of averaging many single-period measurements to determine the mean. Under the conventional approach, the standard deviation of the mean is reduced in proportion to the square root of the number of measurements (each of a single cycle) used to generate an average in each set. By contrast, it has been found, surprisingly, that when the mean is determined according to a measured duration of a series of consecutive pulses, the standard deviation of the mean is reduced in proportion to the number of periods in the measurement, i.e. the value n.

Thus in accordance with the present invention, intrinsic noise or jitter is more rapidly determined and more accurately characterized, to facilitate the location of sources of noise within semiconductor circuits or other devices under test. The intrinsic noise due to the measurement system also is reduced, to afford greater accuracy in measurements and enhanced reliability.

IN THE DRAWINGS

For a further appreciation of above and other features and advantages, references made to the following detailed description and to the drawings, in which.

DETAILED DESCRIPTION OF THE PREFERRED EMBODIMENTS

Figure 1:
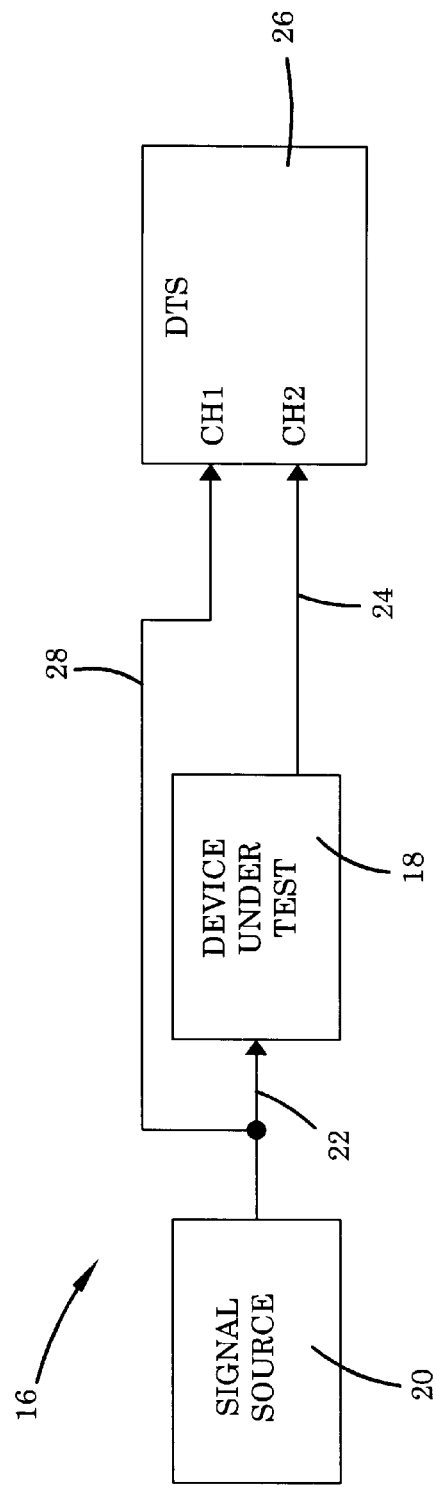
FIG. 1 is a schematic view of a measurement system for analyzing waveforms in accordance with the present invention.

Turning now to the drawings, there is shown in FIG. 1 a time measurement system 16 for measuring signals propagating through a device 18, e.g. a semiconductor chip. The system includes a signal source 20 such as an HP8110A pulse generator, coupled to device 18 through a transmission line 22 and providing a series of pulses to the device. The pulses propagate through the device, and are provided via a transmission line 24 to a time interval analyzing instrument 26, for example, a DTS2075 digital timing system, available from Wavecrest Corporation. Instrument 26 also receives the pulse series directly from source 20, via a transmission line 28.

Instrument 26 has two channels for receiving pulse trains. The inputs to the instrument are labeled "CH1" and "CH2," indicating the separate channels for receiving the output from signal source 20 and device 18, respectively. In this configuration, instrument 26 can be used to determine the propagation time of the signal through device 18.

A variety of alternative options may be employed to couple device 18 and analyzer 26, depending on the test involved. For example, a data output and a clock output of a device can be coupled to channels 1 and 2 respectively, to determine the precise timing relationship between these outputs. Two ideally parallel data paths through device 18 may be coupled to different channels, to determine skew. In the present disclosure, the connection of primary interest is a coupling of the device output with one of the channels, using the single channel to analyze a pulse stream along a single path, to study a clock signal or other repetitive waveform. In this case, the waveform is tested for timing errors or intrinsic noise, i.e. jitter representing the deviation of the actual pulse from the ideal, absolutely stable waveform in which all pulses or cycles have the same period.

Figure 2:
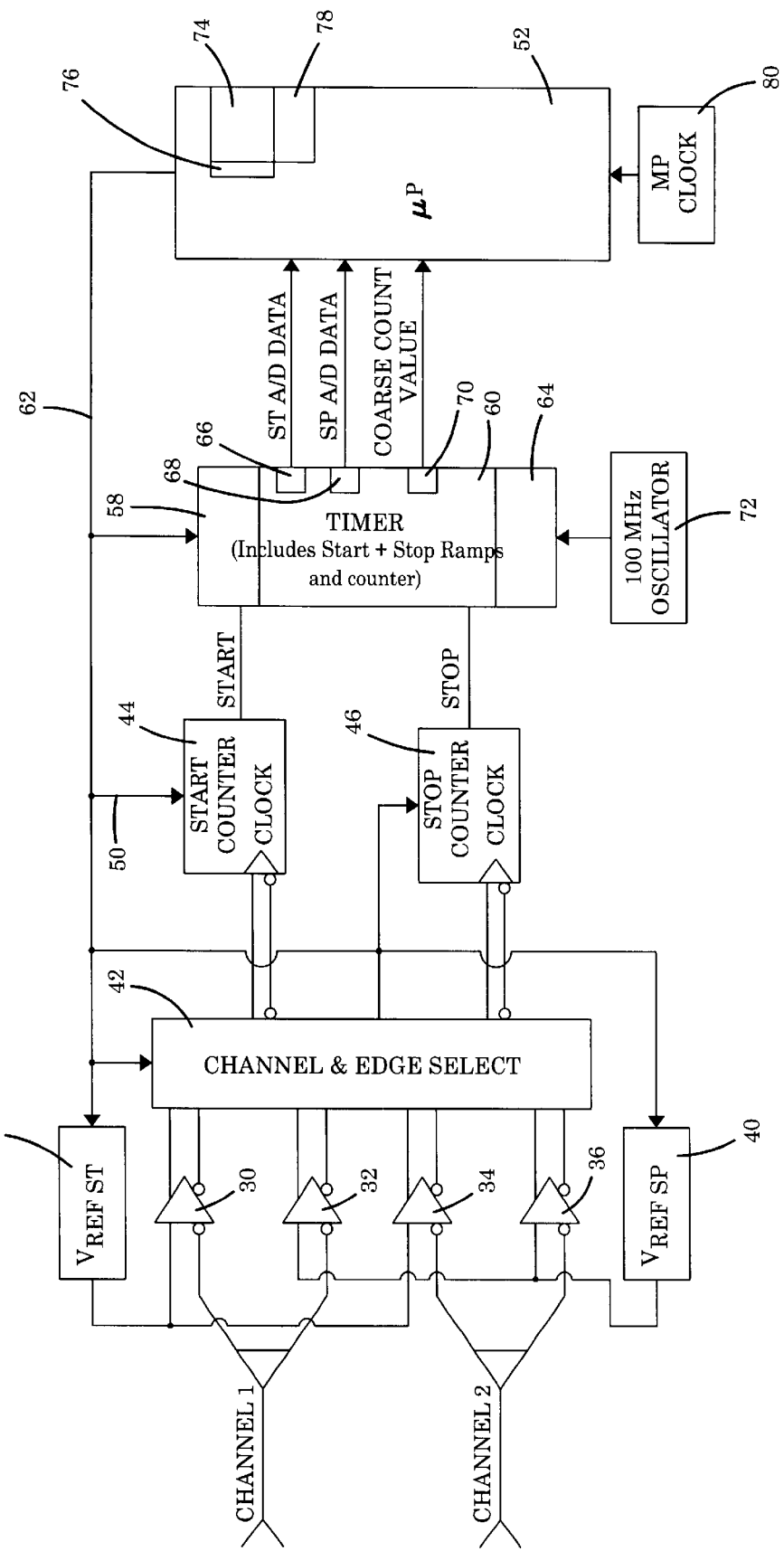
FIG. 2 is a schematic view of time interval analyzing circuitry forming part of the system shown in FIG. 1.

FIG. 2 is a schematic view of circuitry within time interval analyzing instrument 26. The circuitry measures time intervals according to the principle discussed in U.S. Pat. No. 4,908,784 (Box), assigned to the assignee of the present application and incorporated by reference herein. More particularly, each time interval consists of a start ramp, a stop ramp, and a whole number of counts intermediate the start ramp and stop ramp. Each of the start and stop ramps can interpolate a fraction of a count.

The circuitry in FIG. 2 includes four high frequency comparators (comparator amplifiers): comparators 30 and 32 receiving the channel one input, and a pair of comparators 34 and 36 receiving the channel two input. A constant voltage source 38 provides a reference voltage input to comparator 30 and comparator 34, while a constant voltage source 40 provides a stop reference voltage to comparators 32 and 36. The associated reference voltage to each comparator provides a threshold for recognizing each incoming transition of a pulse or period. Each comparator generates an output in response to its channel input crossing the voltage threshold.

Each of comparators 30–36 provides its output to a channel and edge select logic circuit 42. Logic circuit 42 selects sources (i.e. channels) depending on the intended purpose of the measurements. Measurements such as frequency, pulse width, and period require the output of a single channel only, whereas measurements of propagation delay usually require comparison of two different signals. Logic circuit 42 also insures that all pertinent timing edges are passed to the next stage.

Figure 3:
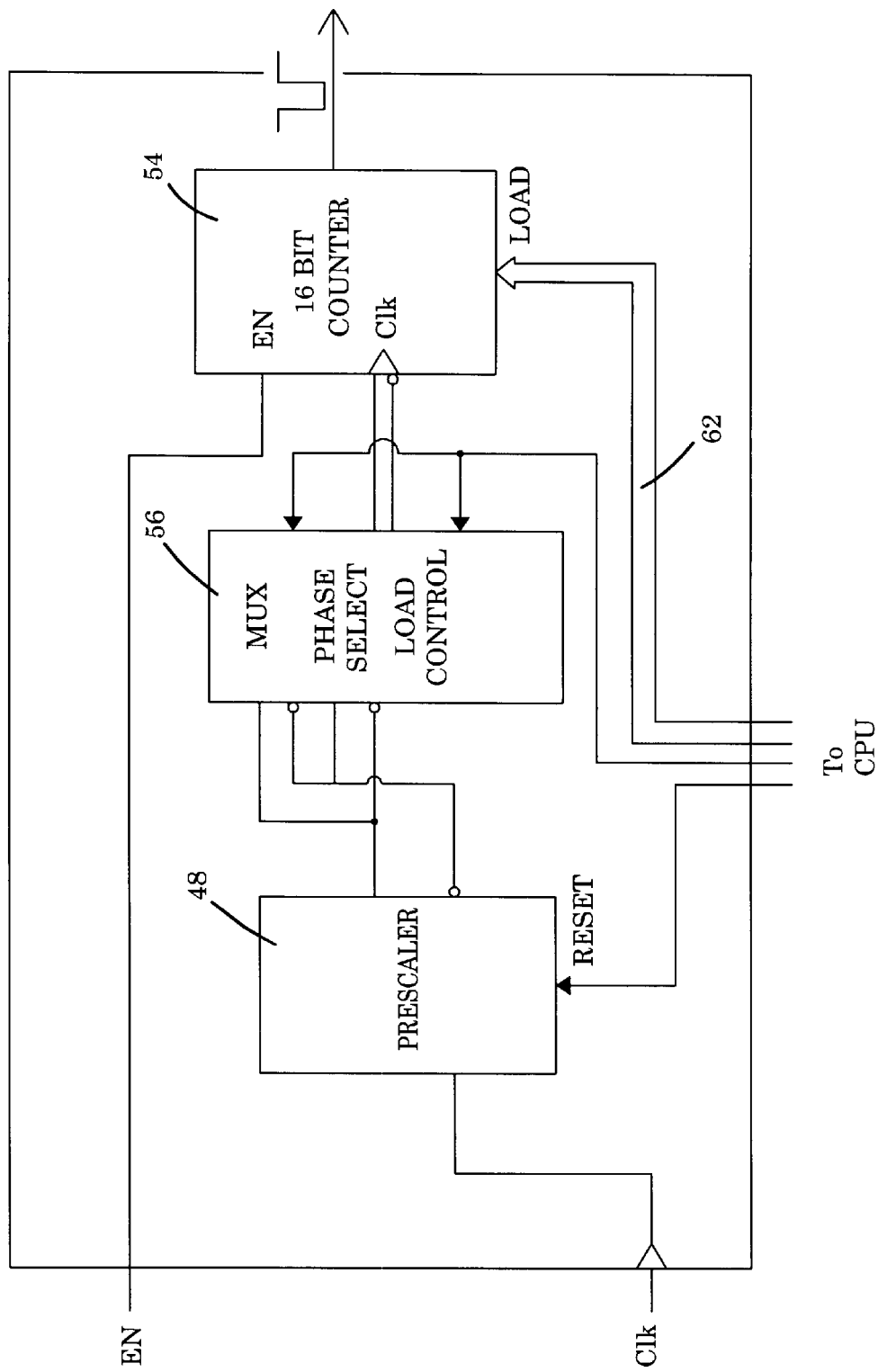
FIG. 3 is a more detailed schematic view of a portion of the circuitry in FIG. 2 used to accumulate counts of events detected by the circuitry.

The output of logic circuit 42 is provided, differentially, to a start counter 44 and a substantially identical stop counter 46. Start counter 44 is shown in greater detail in FIG. 3. Counter 44 includes a prescaler 48 receiving a differential start input (signal edge) from select logic circuit 42. The counter receives an enabling input 50, a measuring command from a microcomputer 52 coupled to insure that the enable command is synchronized with the input signal. The prescaler, which provides a one bit counter, provides a pulse to a sixteen bit binary counter 54 via a phase select and load control circuit 56. Thus, prescaler 48 and counter 54 combine to provide a seventeen bit counter with a maximum count of 131,072. The binary counters 48 and 54 are loaded with a complement (inverse) of a predetermined number N of occurrences, e.g. rising edges of cycles, in the pulse stream. Accordingly, the occurrences are recognized, but the appropriate action, such as the initiation of any measurement, is not taken until the Nth occurrence. At the Nth occurrence, counter 54 enables a measurement flip-flop to initiate a start ramp 56 of timing circuit 60 (FIG. 2). Data/address busses 62 couple microcomputer 52 to circuit 42, counters 44 and 46 and timing circuit 60.

While only start counter 44 is shown in detail, stop counter 46 is the same, comprised of components that are counterparts to the components described in connection with counter 44.

When triggered, flip-flops in counters 44 and 46 provide differential outputs, each to its associated one of start ramp circuit 58 and a stop ramp circuit 64. The ramps exhibit a highly linear time response that enables extremely accurate measurements, as more fully explained in U.S. patent application Ser. No. 09/039,344 entitled "Time Interval Measurement System Incorporating A Linear Ramp Generation Circuit", assigned to the assignee of this application and filed concurrently herewith. The analog outputs of ramps 58 and 64 are provided to respective A/D converters 66 and 68. The digital outputs of the A/D converters and a counter 70, are provided to processor 52, where the digital value is converted to a time measurement.

Timing circuit 60 is governed by a 100 MHz oscillator 72. Accordingly, the duration of each coarse count is ten nanoseconds, and the start and stop ramps generate voltages which can represent fractions of the ten nanosecond intervals. Thus, each duration or time value provided to microprocessor 52 from timing circuit 60 is the sum of a whole number of ten-nanosecond intervals (coarse count), plus a fraction of an interval (start ramp), less a trailing fraction of interval (stop count). Microprocessor 52 includes a memory 74 with multiple registers for storing time values, and an address register 76 to facilitate storing the time values so that they can be identified individually, and also categorized, e.g. by number of cycles of the waveform when a series of consecutive cycles is measured. The processor 52 also includes arithmetic processing circuitry 78 coupled to the memory, for performing arithmetic operations on the time values stored in the memory. The microprocessor is governed by a microprocessor clock 80, independent of oscillator 72.

Figure 4:
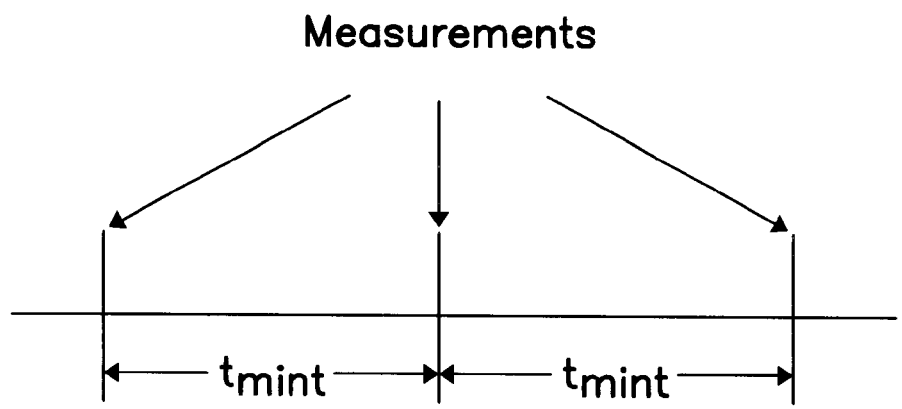
FIG. 4 is a timing diagram illustrating measurement intervals at which the circuitry in FIG. 2 is used to take signal measurements.

As represented schematically in FIG. 4, microprocessor 52 is programmed to generate the enabling signal to counters 44 and 46 at a predetermined nominal measurement rate of about 43 kHz, for a nominal interval of about 23 microseconds between successive measurement commands. The measuring rate is not absolutely constant. Rather, due to internal circuitry in microprocessor 52, and the governance by different clocks 72 and 80 so that inputs to the microprocessor are asynchronous with its internal timing, the actual measurement rate varies randomly about the nominal measurement rate, e.g. 23 microseconds, over a 4 microsecond range. The utility of this feature is discussed below.

Figure 5:
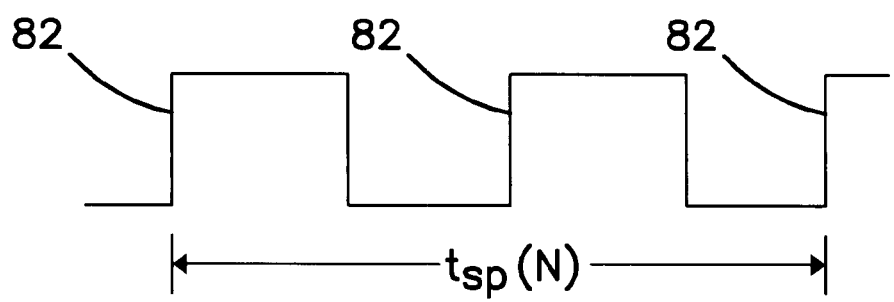
FIG. 5 is a diagram of a repetitive waveform to be measured by the circuitry.

FIG. 5 shows a repetitive waveform, in particular a clock signal 80. Each repeating pulse of the clock signal has a rising edge 82. Accordingly, the duration of a single period can be determined by measuring the interval between one rising edge 82 and the next. As indicated in the figure, a duration or time value can represent two or more periods. Multiple period measurements are accomplished by setting the appropriate one of counters 44 and 46 with the integer "n" indicating the number of periods the measurement is intended to encompass. Then, stop counter 46 (for example) senses each rising edge or "event," but simply accumulates a count of the events until the "Nth" event, at which time the stop action is triggered. This can be thought of as an "arm on the Nth event" instruction to the counter.

Figure 6:
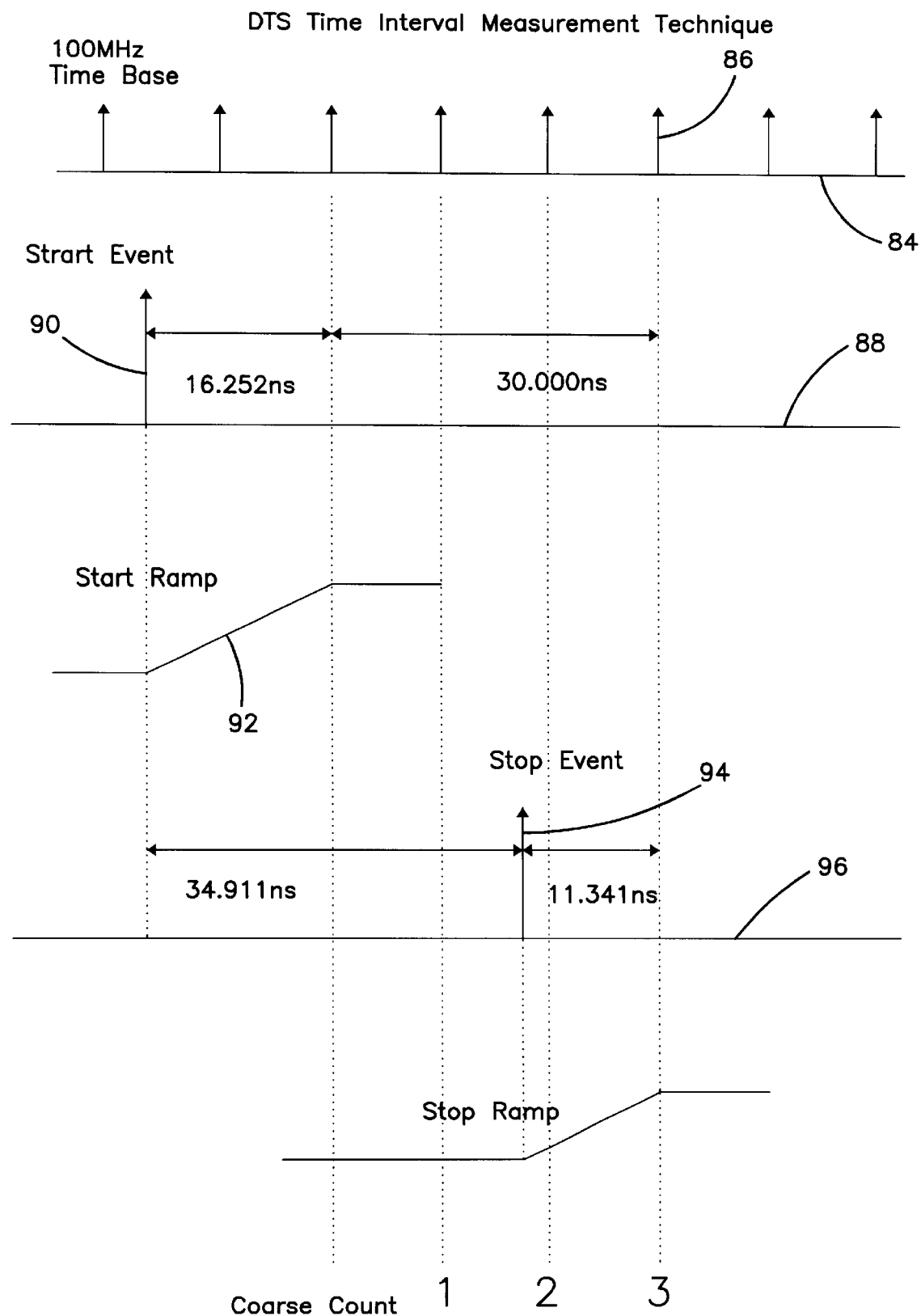
FIG. 6 is a timing diagram illustrating the manner in which the circuitry measures time intervals.

The actual timing of intervals is perhaps understood from the timing diagram in FIG. 6. Line 84 illustrates the discrete 10 nanosecond intervals defined by time base edges 86 from oscillator 72. Line 88 indicates a start event 90 e.g. a rising edge of a pulse input to ramp circuit 58. As indicated by a line 92 representing voltage, the start event initiates a voltage increase that is linear with time (constant slope) and continues until the second time base edge 86 following the start event. In this case, the length of the start ramp is 16.252 ns.

A stop event 94 is shown along a line 96. The stop event initiates a voltage increase that is linear, and ends at the second time base edge 86 after the stop event, in this case totaling 11.341 ns. The coarse count is the number of whole cycles, beginning with the cycle at the end of the start ramp and ending with the cycle at the end of the stop ramp. Accordingly, the complete interval from the start event to the stop event is the coarse count, plus the start ramp interval, less the stop ramp interval.

Time interval analyzing instrument 26 is well suited for analyzing the noise component of data and clock signals. In accordance with the present invention, start counter 44 and stop counter 46 are employed not only to rapidly characterize the jitter components of repetitive waveforms, but to reduce jitter due to the measurement system.

Counter 44, counter 46, or both, can be used in generating functions having the properties of auto-correlation functions that accurately portray modulation domain information on a signal in the frequency domain.

The first step in the auto-correlation technique is to time the duration of a series of "N" consecutive periods for a range of different spans (values of N). Each span is measured repeatedly to generate a statistical distribution for each span. For example, 1,000 spans are selected, each span measurement executed 100 times (i.e. M=100). The result is a distribution of time values provided individually for each value of N. A variance of the durations or time values t is generated according to equation (1) above. Again, M is the number of measurements taken of the span of N cycles; t(N) represents a series of M individual measurements of the span; and $\bar{t}(N)$ is the mean value or average of the values t(N), for that span. In the present example, there are 100 measurements or values of t. This step is repeated for each value of N, in this case by incrementing N from an initial span of one period to a final span of 1,000 periods of the waveform. The result is an array of the variance values, one associated with each value of N.

The success of this procedure depends in large part upon the ability to achieve a reliable estimate of the variance with respect to each span or value of N, which in turn depends on the ability to generate a random statistical sample for each span. It has been found that a dithered measurement rate is particularly beneficial in this regard. With reference to FIG. 2, it has been noted that microprocessor 52, and timing circuitry 60 which provides the raw measurement values to the microprocessor, are governed by different clocks. This, and the internal components of microprocessor 52, cause the measurement rate to vary as noted above, such that the interval between successive enable signals, while nominally 23 microseconds, varies about the nominal interval to provide a 4 microsecond range of intervals (see FIG. 4). The varying measurement rate leads to more random statistical samples. Although dithering in the present case arises from the components involved and the manner in which they are coupled, a random number generator or other auxiliary component could be added to the circuit, if desired, to increase the variability in the measurement rate.

Figure 10:
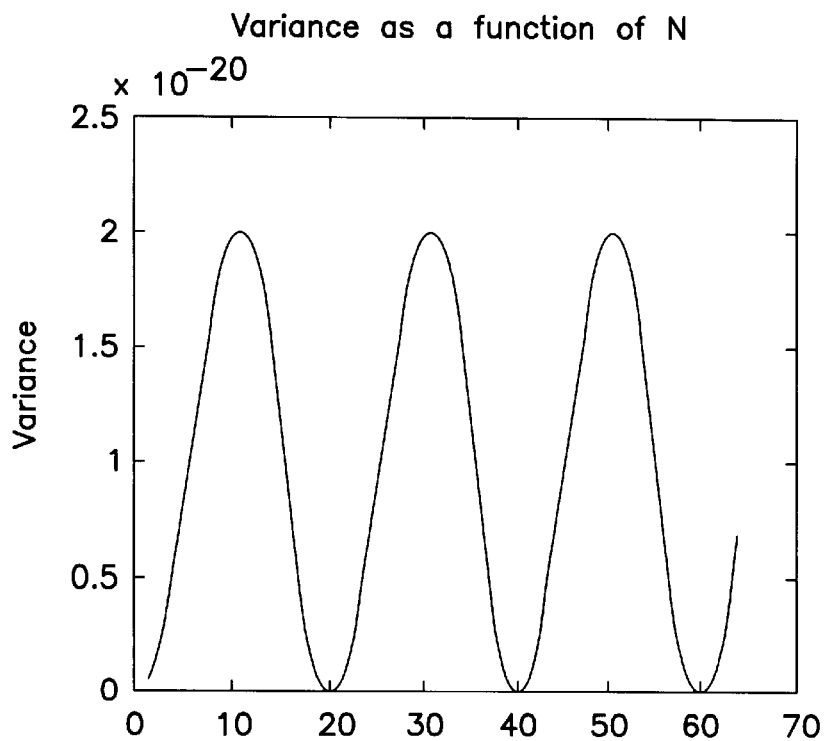
FIGS. 10–15 illustrate stages of use of the circuitry to generate a visual representation of jitter in a frequency domain.

Thus, the initial steps in generating an auto-correlation function include generating sets of multiple time measurements, one set for each of many different spans of N cycles. The result is a set of variance values as a function of N, which can be represented graphically as shown in FIG. 10 for the case of 64 sets of values, ranging from N=1 through N=64.

The variance (-N) equals the variance (N). In other words, the auto-correlation function is symmetrical about 0. This property enables the variance vs. N function to be "mirrored" about 0, to yield a function ranging over 129 points or values of N, i.e. twice the original number plus a point corresponding to 0. This will increase the frequency resolution of a Fourier transform applied to the data. The result is shown in FIG. 11.

Figure 11:
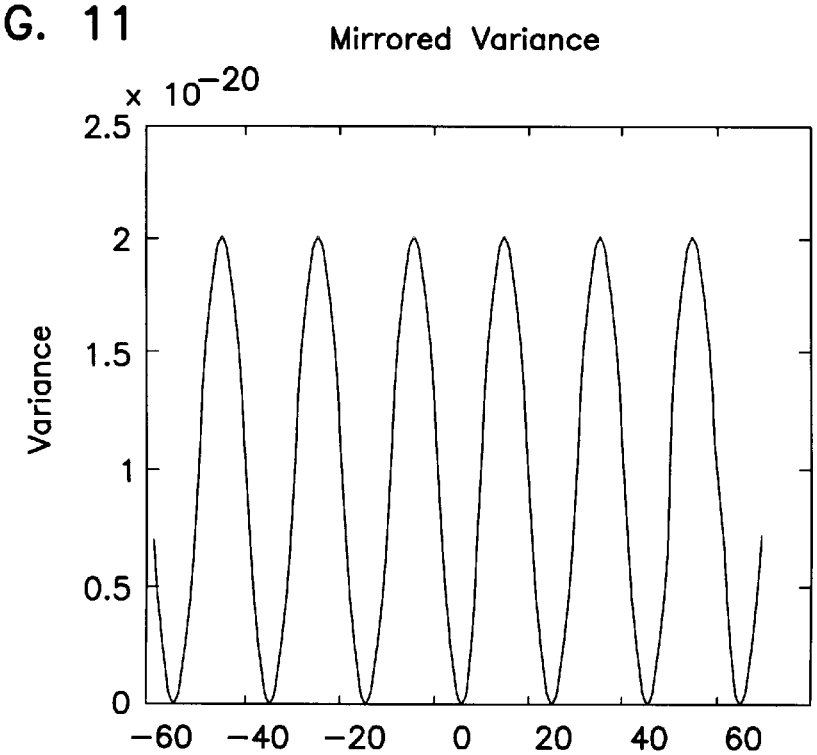
Figure 12:
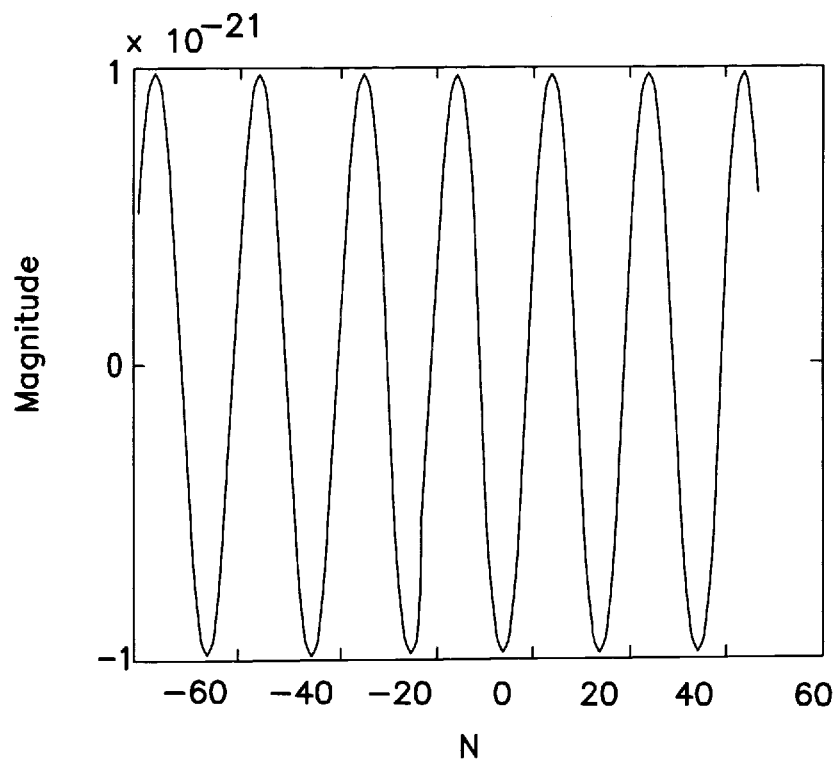

Next, to normalize the magnitude of the Fourier transform display to be generated relative to one clock period, a second derivative is performed on the function shown in FIG. 11. The result is seen in FIG. 12, where the differentiation has removed two points so that 127 values of N remain. Other normalization functions may be used, for example, to normalize the magnitude of the display relative to multiple clock periods.

Figure 13:
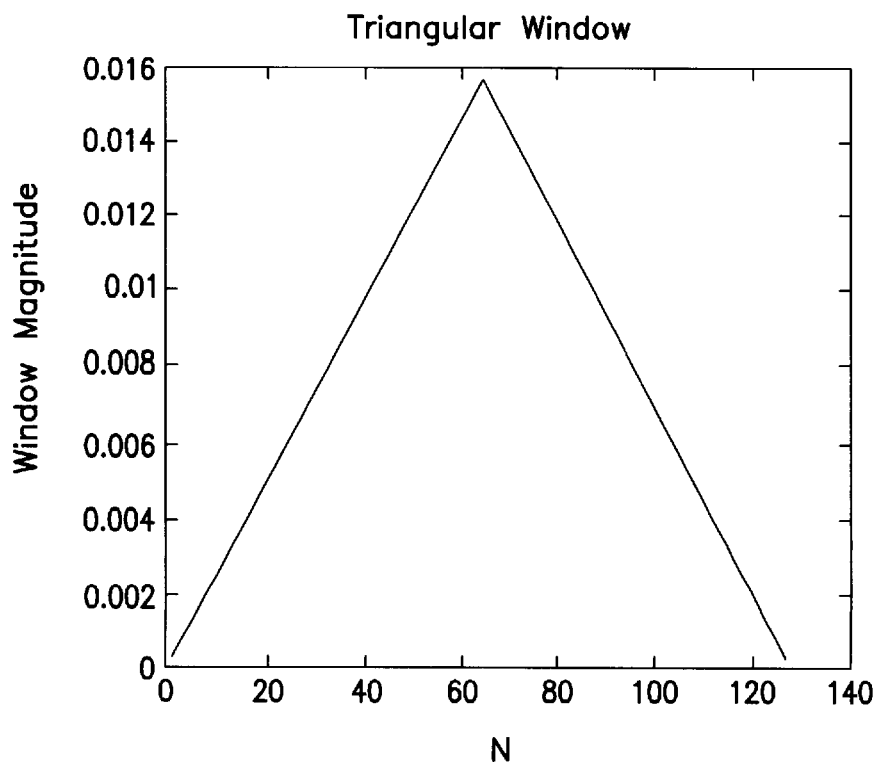

Next, the data in FIG. 12 are multiplied by a window function, for example a triangular window as shown in FIG. 13. Alternative types of window functions may be used, e.g., rectangular, Kaiser-Bessel, Gaussian, Hamming, Blackman, and Hanning. The result of this multiplication is shown in FIG. 14.

Figure 14:
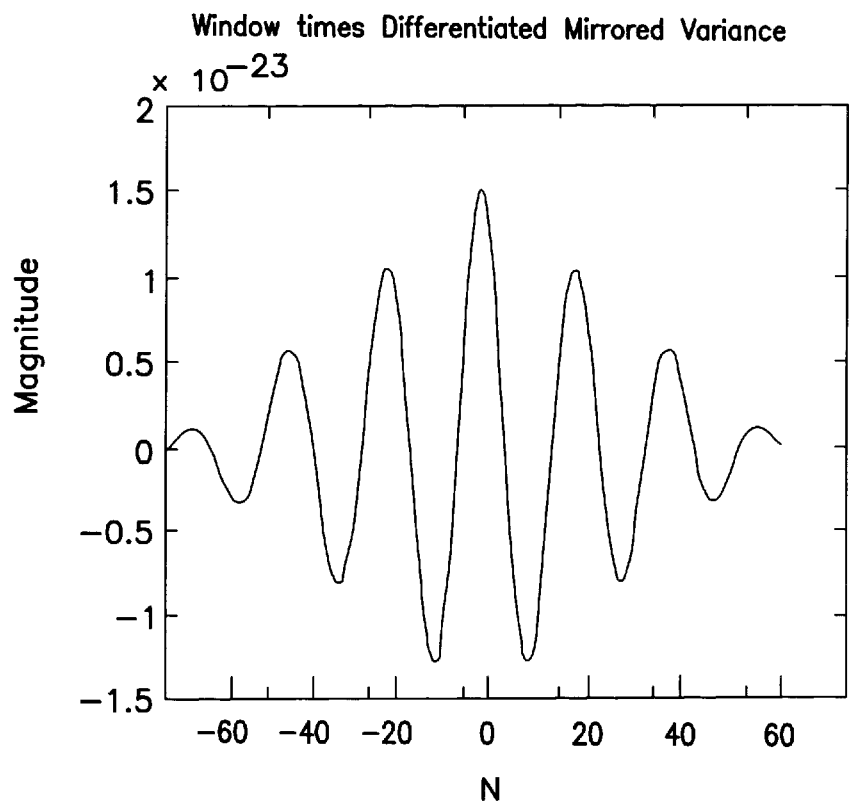

Then, a discrete Fourier transform is performed upon the data shown in FIG. 14, converting time domain data into frequency domain data. A zero padding step may be applied to the data before the discrete Fourier transform, to improve the frequency resolution and magnitude accuracy of the resulting display. To adjust the magnitudes in the frequency domain to seconds (rather than seconds squared), a square root function is applied.

For random jitter, the discrete Fourier transform is summed, and its square root is taken, resulting in a one-sigma estimate of random jitter.

Figure 15:
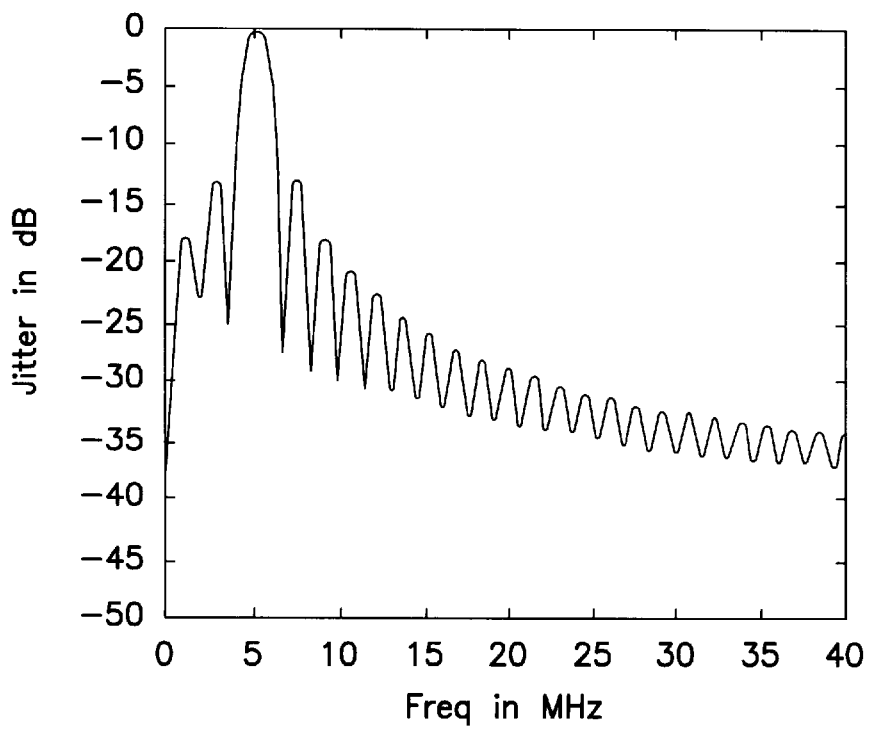

Returning to the case of periodic jitter, the result of manipulating the data of FIG. 14 as discussed is shown in FIG. 15, which has a 0 dB maximum level in seconds peak relative to periodic jitter over one period of a clock signal. The width of the principal lobe and side rejection vary with the particular window used.

According to another aspect of the invention, periodic jitter, or any other periodic angle modulating waveform, can be reconstructed based on the range of time measurements, as an alternative to the foregoing approach of identifying frequency components based on the variance of time measurements. Initially the two procedures are similar. Each involves taking multiple measurements at multiple different spans or values of N, to generate sets of data corresponding to different cycle spans. This procedure, however, involves range data rather than variance data.

Figure 16:
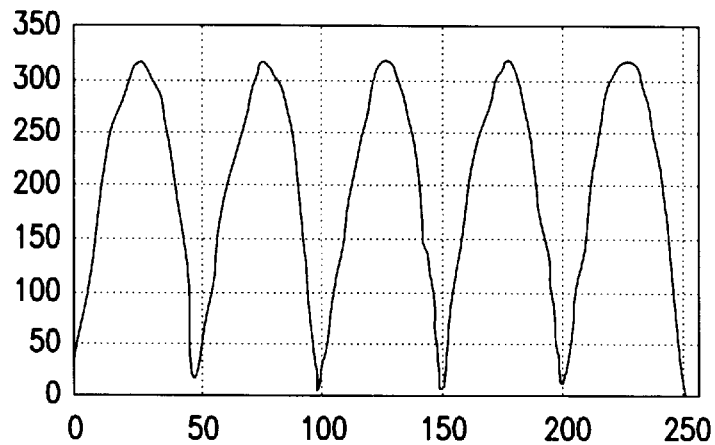
FIGS. 16–19 illustrate use of the circuitry to reconstruct a modulating wave of a frequency modulated signal based on accumulated range data.

In particular, a duration of "N" consecutive cycles in a repetitive waveform are timed. This is repeated multiple times, e.g., 100 times, for the particular N value. For the resulting set of measured time values, the range is found by subtracting the minimum measured time from the maximum measured time. This process is repeated for a range of values of N, N once again being an integer. For example, FIG. 16 illustrates range values as a function of N, for a range of N=1 through N=250.

Next, the array of range values is differentiated. Representing the array of range vs N data as A[N], differentiation involves generating an array B[N], where $$B[n]=A[n+1]-A[n]$$

Figure 17:
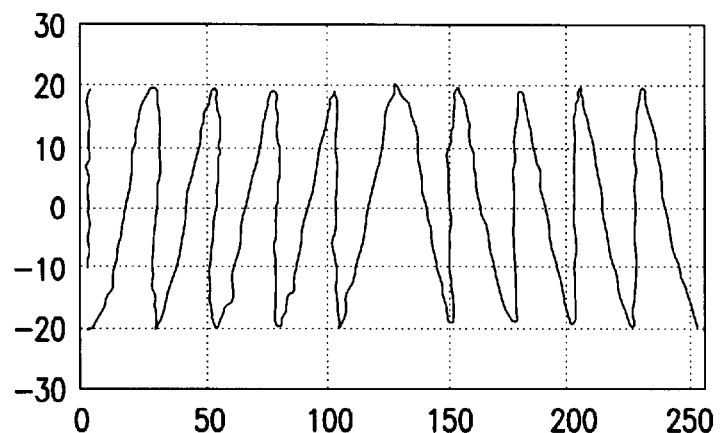

The differentiated array is constructed symmetrically about a designated central location, thus to reorder the array. This is accomplished by generating a new data array C[N], where $C[N/2+\text{integer}((n+1)/2)*(-1^n)]=B[n]$. The result is shown in FIG. 17. This array (with appropriate scaling) can be interpreted as a time domain view of the modulating waveform, with a 180 degree phase ambiguity.

Figure 18:
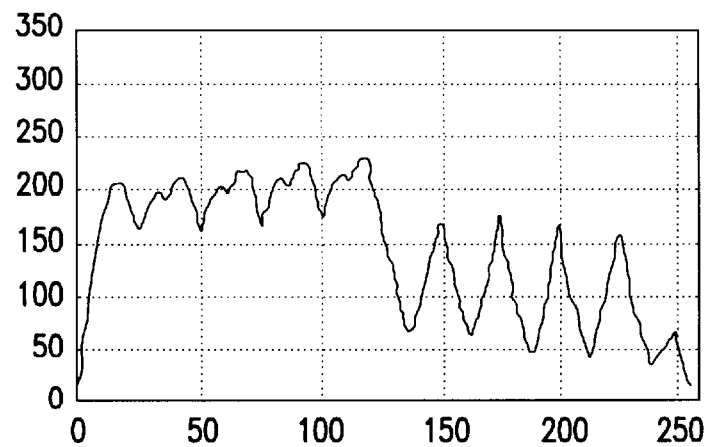
Figure 19:
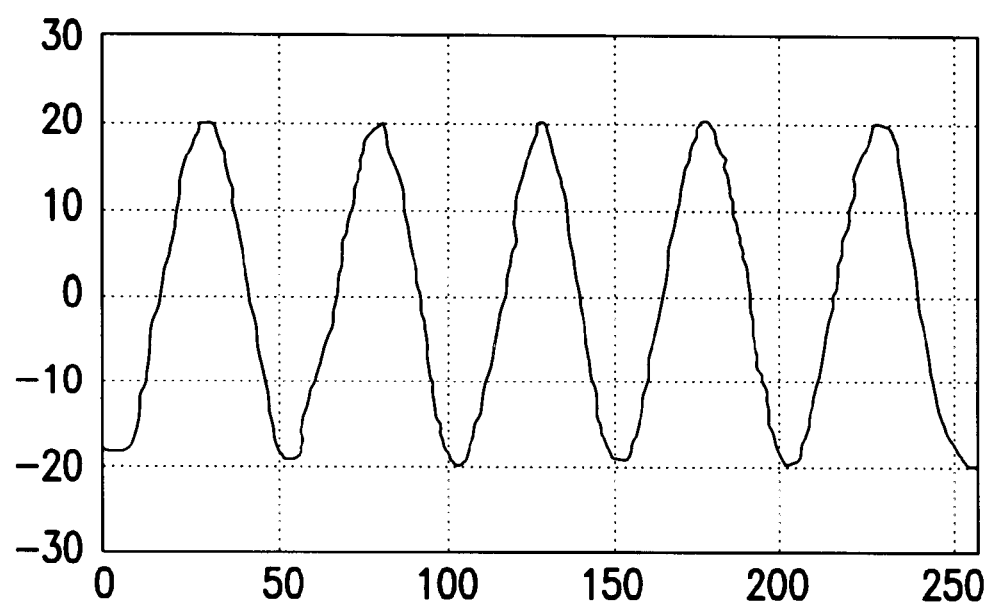

In order to identify the proper phase of the data in array C[N], the next step is to generate an array D[N] based on the assumption that the array C[N] represents the modulating signal. Each element $D_p$ of the data array D[N] can be generated by finding the maximum and minimum values of a sum of any "p" adjacent elements in the C[N] array, subtracting the minimum from the maximum, and taking the absolute value. Such an array is shown in FIG. 18.

The array D[N] is compared to the original array A[N] shown in FIG. 16, for example using RMS difference. Next, the array C[N] is inverted selectively, i.e., selected ranges are multiplied by negative one. Based on the revised array C[N], a new array D[N] is generated, compared with array A[N], and a different set of selective inversions are applied to the data in the array C[N].

This process (i.e., generating, comparing, inverting) is repeated until a reasonable correspondence to the array A[N] is achieved. One preferred approach for determining the possible inversion boundaries in the array C[N] is to identify the values associated with negative-to-positive transitions in the function B[N].

The foregoing procedure is more complex than the procedure involving variance data. However, range data, unlike the variance data, retains some phase information, and thus may be used to provide a more detailed reconstruction of a modulating signal.

Further in accordance with the present invention, time measurement system 16 facilitates techniques useful for characterizing low frequency jitter, i.e. jitter having frequencies lower than the measurement rate of the system.

The dithered measurement rate affords the capacity to distinguish true jitter frequency components from aliasing products. In connection with this feature, FIG. 7 is a chart of modulating signal amplitude as a function of frequency, and illustrates two frequency components 98 and 100 on opposite sides of a Nyquist frequency 102, i.e. one-half of the measurement rate.

Figure 7:
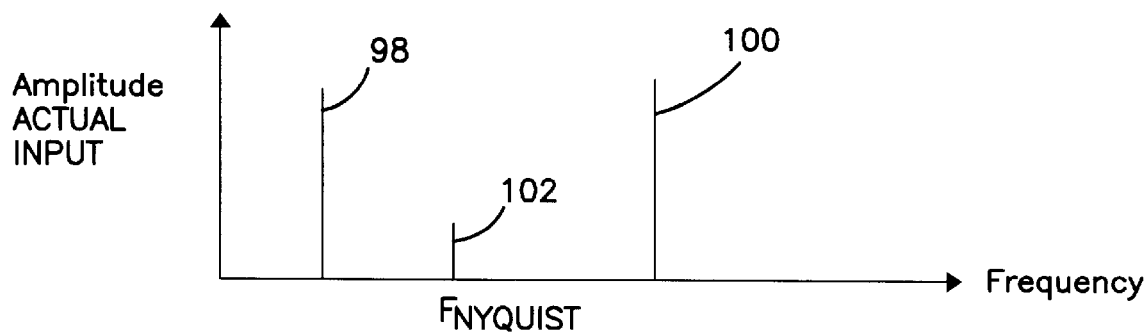
FIGS. 7–9 are frequency domain graphs illustrating an anti-aliasing feature of the circuitry.
Figure 8:
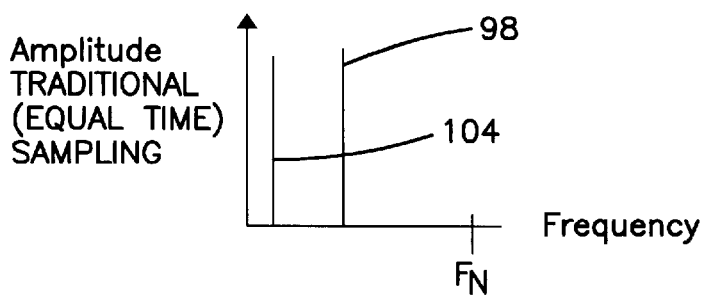

FIG. 8 illustrates how the occurrence shown in FIG. 7 is measured in a system with a constant measurement rate. In particular, signal 98 represents a true measurement of the same component in FIG. 7. A "signal" 104, however, represents an aliasing product due to component 100 in FIG. 7. As one example, if component 100 is 107 kHz and the measurement rate is 100 kHz, the measurement yields a false indication of a 7 kHz component in FIG. 8.

Figure 9:
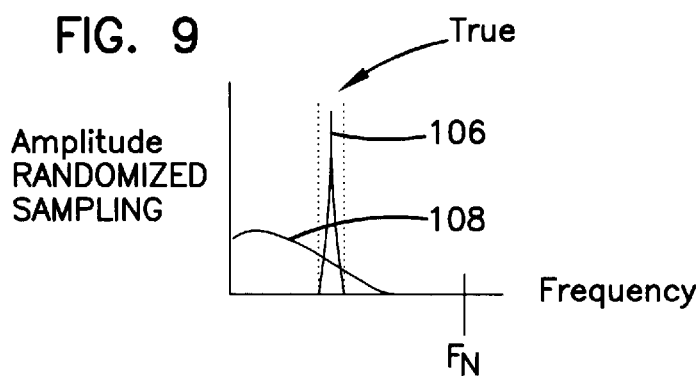

The impact of aliasing products is considerably reduced, however, when the measurement rate is dithered about an average or nominal measurement rate, to vary randomly over a range that encompasses the nominal measurement rate. Then, when multiple measurements are taken of a given span of N cycles in the repetitive waveform, and represented graphically as consecutive readings, a discrete Fourier transform can be performed on the data to generate a graph of modulating signal amplitude as a function of frequency, as shown in FIG. 9. When using a dithered measurement rate, the true component, as indicated by 106 in FIG. 9, is slightly spread over a narrow width of frequencies. In contrast, the measured frequencies of aliasing products are spread over a much broader range of frequencies, as indicated at 108. The true signals are distinguished due to their narrower widths.

Another salient feature of the system is that it provides for a more robust averaging technique usable to reduce measurement error, i.e. jitter due to the measuring system itself rather than the device under test.

A standard method of reducing instrument noise is to average multiple one-period measurements. The error, which can be expressed in terms of a standard error of the mean, is proportional to $1/\sqrt{M}$, where M is the number of one-period measurements. To reduce the standard error of the mean by one-half, the number of measurements must be quadrupled.

According to the present invention, instrument noise is not determined by measuring individual periods. Rather, an average is found by measuring the time of a "span" of periods, each span encompassing a predetermined number N of periods, and then dividing the result by N. The number N is determined by an input to one of counters 44 and 46 to accumulate "N" cycles of a repeating waveform before ending a particular measurement. This can be thought of as an "arm on Nth event" input to the particular counter. For example, assuming the "event" that governs measurement is the rising edge of a pulse or period of the pulse steam, the counter recognizes each event after the initial event that triggers the measurement. Each event through N–1 is recognized only to the-point of accumulating (or decrementing) the counter involved. The final or Nth event stops a particular measurement. In practice, typical values of N range up to 1,000.

A salient feature of this approach is that the standard error of the mean is reduced in direct proportion to the value N. Accordingly, the standard error can be reduced by one-half by a doubling of N, rather than quadrupling, as is required of the number of samples M in the conventional approach. In short, all values of N greater than one reduce noise, according to the relation $20*\log_{10}(N)$. For example, if N equals 1,000, instrument noise is reduced by 60 dB.

Thus, in accordance with the present invention, noise components in repetitive waveforms are more rapidly determined and more accurately characterized. Noise due to a measuring system is considerably reduced, for more reliable measurements of devices under test. A varying measuring rate is used to diminish the effect of aliasing products, and to provide random statistical samplings for reliable generation of variance values over a range of period spans. As a result, semiconductor chips and other high frequency devices can be more accurately tested and faults more readily identified and eliminated, for improved product performance.

For further information about certain concepts expressed herein, including fast Fourier transform, auto-correlation, applying a discrete Fourier transform to an auto-correlation function (known as the Blackman-Tukey method), aliasing, window multiplication and padding, references made to a text by Efeachor and Jervis entitled *Digital Signal Processing: A Practical Approach.* 1993, Addison-Wesley Publishing, Inc. A related technique for creating an auto-correlation function of jitter, known as Allan variance, is discussed in *Time and Frequency: Theory and Fundamentals* (Byron E. Blair, Ed.) National Bureau of Standards (1974). Mathematical equations supporting the procedures discussed herein are found in the above referenced Provisional Application No. 60/039,624.

What is claimed is:

1. A process for estimating random jitter in a repetitive waveform, including:
    a. timing a duration of a series of "n" consecutive periods in a repetitive waveform a plurality of times for a given "n," where "n" is an integer, to generate a set of time values associated with the given "n;"
    b. determining a variance value for the set of time values;
    c. repeating steps (a) and (b) for a plurality of different values of n; and d. generating an array of the variance values as a function of the values of "n."

2. The process of claim 1 wherein:

said step of repeating steps (a) and (b) for a plurality of different values of n comprises incrementing the value of n by a single additional period through a predetermined range of values of n.

3. The process of claim 1 wherein:

said timing comprises measuring the consecutive periods of the waveform at a dithered measurement rate.

4. The process of claim 1 wherein:

said timing includes generating a set of multi-cycle time values associated with each given N, and determining variance comprises, in connection with each N, applying the equation:

$$\text{var.}[t(N)] = (1/M) \sum_{i=1}^{M} [t(N) - \bar{t}(N)]^2$$

where M is the number of time values in the set; t(N) is one of a series of cycle time values in the series from 1 through M; and $\bar{t}$(N) is the average of the cycle time values.

5. The process of claim 1, wherein:

said step of repeating steps (a) and (b) for a plurality of different values of n comprises incrementing the value of n by a single additional period through a predetermined range of values of n;

said timing comprises measuring the consecutive periods of the waveform at a dithered measurement rate; and wherein the process further comprises e. applying a normalizing function to the array of variance values as a function of N;

f. multiplying the result of step e by a predetermined window function to generate a windowed array; and g. performing a Fourier transform on the windowed array to generate, an estimate of random jitter.

6. The process of claim 1 further including:

e. applying a normalizing function to the array of variance values as a function of N;

f. multiplying the result of step e by a predetermined window function to generate a windowed array; and g. performing a Fourier transform on the windowed array to generate an estimate of random jitter.

7. The process of claim 6 wherein:

the performing of the Fourier transform includes applying a square root function, to yield a resultant function in terms of seconds rather than seconds squared.

8. The process of claim 6 wherein:

the step of applying a normalizing function comprises generating a second derivative of the array of variance values.

9. The process of claim 6 further including:

generating an array of the variance values as a function of −n, to create a mirrored array of the variance values as a function of the values n and −n;

wherein the step of applying the normalizing function comprises applying the normalizing function to the mirrored array.

* * * * *

UNITED STATES PATENT AND TRADEMARK OFFICE
CERTIFICATE OF CORRECTION

PATENT NO.     : 6,449,570 B1                                            Page 1 of 1
DATED          : September 10, 2002
INVENTOR(S)    : Wilstrup et al.

It is certified that error appears in the above-identified patent and that said Letters Patent is hereby corrected as shown below:

Title page,
Item [75], Inventors, "Jan B. Wilstrup, Moundsview, MN" should read -- Jan B. Wilstrup, Mounds View, MN --

Column 1,
Line 19, "trasfer" should read -- transfer --
Line 42, "pulse ses" should read -- pulse streams --

Column 2,
Line 24, "determiined" should read -- determined --

Signed and Sealed this

Fourteenth Day of October, 2003

JAMES E. ROGAN
*Director of the United States Patent and Trademark Office*